(12) United States Patent
Hurwitz et al.

(10) Patent No.: US 11,650,269 B2
(45) Date of Patent: May 16, 2023

(54) SPLIT COIL ARRANGEMENT FOR NON-DISRUPTIVE MEASUREMENT OF AXIAL MAGNETIC FLUX AS PART OF SYSTEM TO INFER MACHINE HEALTH

(71) Applicant: Analog Devices International Unlimited Company, Limerick (IE)

(72) Inventors: Jonathan Ephraim David Hurwitz, Edinburgh (GB); Christopher Thomas Brown, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/412,168

(22) Filed: Aug. 25, 2021

(65) Prior Publication Data
US 2023/0066970 A1   Mar. 2, 2023

(51) Int. Cl.
*G01R 33/02* (2006.01)
*G01R 33/00* (2006.01)

(52) U.S. Cl.
CPC ......... *G01R 33/02* (2013.01); *G01R 33/0023* (2013.01)

(58) Field of Classification Search
CPC .......................... G01R 33/02; G01R 33/0023
See application file for complete search history.

(56) References Cited

U.S. PATENT DOCUMENTS

| | | | |
|---|---|---|---|
| 5,245,307 A | 9/1993 | Klaus et al. | |
| 6,965,225 B2 | 11/2005 | de Buda | |
| 7,164,263 B2 | 1/2007 | Yakymyshyn et al. | |
| 8,723,631 B2 | 5/2014 | Klein | |
| 9,354,257 B2 | 5/2016 | Williams | |
| 10,324,141 B2 | 6/2019 | Latham et al. | |
| 10,739,384 B2 | 8/2020 | Tang et al. | |
| 10,847,299 B2 | 11/2020 | Mao et al. | |
| 2003/0006765 A1* | 1/2003 | Nekado | G01D 5/2033 324/258 |
| 2003/0098783 A1* | 5/2003 | Pagnol | G06K 7/0008 340/10.1 |
| 2015/0270057 A1* | 9/2015 | Lestician | H01F 27/2823 323/361 |
| 2015/0292962 A1* | 10/2015 | Lu | G01L 3/102 73/862.69 |
| 2019/0072374 A1* | 3/2019 | Mann | G01B 7/24 |

FOREIGN PATENT DOCUMENTS

| | | |
|---|---|---|
| CN | 103698720 A | 4/2014 |
| CN | 104155501 A | 11/2014 |
| CN | 204347109 U | 5/2015 |
| CN | 208421200 U | 1/2019 |
| CN | 212228810 U | 12/2020 |
| JP | 2015-087374 A | 5/2015 |
| WO | WO 2021/021889 A1 | 2/2021 |

* cited by examiner

*Primary Examiner* — Alvaro E Fortich
(74) *Attorney, Agent, or Firm* — Wolf, Greenfield & Sacks, P.C.

(57) ABSTRACT

Axial magnetic flux sensors are described. The axial magnetic flux sensors comprise multiple substrates with conductive traces on them in some embodiments, and in other embodiments a single substrate or no substrate. When multiple substrates are provided, the substrates couple together such that the conductive traces connect to form a coil. The coil may be a continuous, multi-loop coil. When the substrates are coupled together, they may define an opening to accommodate a shaft or other piece of equipment.

21 Claims, 13 Drawing Sheets

SPLIT COIL ARRANGEMENT FOR NON-DISRUPTIVE MEASUREMENT OF AXIAL MAGNETIC FLUX AS PART OF SYSTEM TO INFER MACHINE HEALTH

FIELD OF THE DISCLOSURE

This application relates to axial magnetic flux sensors and related systems and methods.

BACKGROUND

Some types of machinery have a cylindrical geometry and generate a magnetic field along a radial direction and an axial direction. An axial magnetic flux sensor senses magnetic flux along an axial direction.

BRIEF SUMMARY

Axial magnetic flux sensors are described. The axial magnetic flux sensors comprise multiple substrates with conductive traces on them in some embodiments, and in other embodiments a single substrate or no substrate. When multiple substrates are provided, the substrates couple together such that the conductive traces connect to form a coil. The coil may be a continuous, multi-loop coil. When the substrates are coupled together, they may define an opening to accommodate a shaft or other piece of equipment.

According to an aspect of the application, an axial magnetic flux sensor device is provided, comprising: a first substrate; a second substrate couplable with the first substrate to form a substantially planar closed loop; a first plurality of partial loop conductive traces on the first substrate; a second plurality of partial loop conductive traces on the second substrate; and a first pin and socket connector and a second pin and socket connector configured to couple the first and second pluralities of partial loop conductive traces in a single, continuous, substantially planar multi-loop coil.

According to an aspect of the present application, a flux detection system is provided, comprising: a motor comprising a casing and a shaft extending out of the casing; an axial flux sensor positioned around the shaft outside the casing, and comprising: first and second coupled supports forming an opening through which the shaft passes; a first plurality of partial loop conductive traces on the first support; a second plurality of partial loop conductive traces on the second support; a first trace connector coupling the first plurality of partial loop conductive traces with the second plurality of partial loop conductive traces; a second trace connector coupling the first plurality of partial loop conductive traces with the second plurality of partial loop conductive traces; and readout circuitry coupled to at least one trace of the first plurality of partial loop conductive traces and configured to amplify a signal from the at least one trace.

According to an aspect of the application, a sensor for sensing axial magnetic flux is provided, the sensor comprising: two couplable substrates, couplable to form a substantially planar closed loop; partial loop conductive traces on one substrate of the two substrates; partial loop conductive traces on another substrate of the two substrates; and two trace connectors configured to couple the partial loop conductive traces on the two substrates in a single, continuous, substantially planar multi-loop coil.

According to an aspect of the application, an axial magnetic flux sensor device comprising: a rigid substrate; a first plurality of partial loop conductive traces on the rigid substrate; a flex ribbon of conductive traces coupled to the rigid substrate at one end and couplable to the first substrate at a second end of the flex ribbon; a first pin and socket connector configured to couple the second end of the flex ribbon to the rigid substrate to form a single, continuous, substantially planar multi-loop coil.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Aspects of the present application relate to sensors for sensing axial magnetic flux of a machinery. Some machinery such as motors may include moving parts, such as a shaft. One detectable characteristic indicative of the health of machines like motors is the axial magnetic flux they generate. For example, for some machines, a large axial magnetic flux may be a sign of poor machine health. In some situations, changes in the magnitude of the axial magnetic flux may be a sign of changing device operation or deteriorating machine health. Therefore, monitoring the axial magnetic flux of a machine may provide valuable information in terms of machine health, and may be used to make decisions about the necessity and timing of machine maintenance and/or replacement.

In some embodiments, the sensors for sensing axial magnetic flux are configured to be applied to or removed from the machinery without the need to disassemble the machinery. Some machines which generate an axial magnetic field include a rotatable shaft or rotor. The rotatable shaft is often coupled to further components of a system. Thus, aspects of the present application provide axial magnetic flux sensors which may be formed by coupling together discrete pieces around the shaft to form a completed coil without the need to disassemble the machinery, thus reducing or eliminating entirely machine downtime and simplifying the process of positioning the axial flux sensor. In some embodiments, the axial flux sensors described herein include multiple substrates that are couplable to each other and that have conductive traces. Coupling the substrates together connects the traces into a continuous loop through which axial magnetic flux may pass and be detected by the sensor.

Figure 1A:
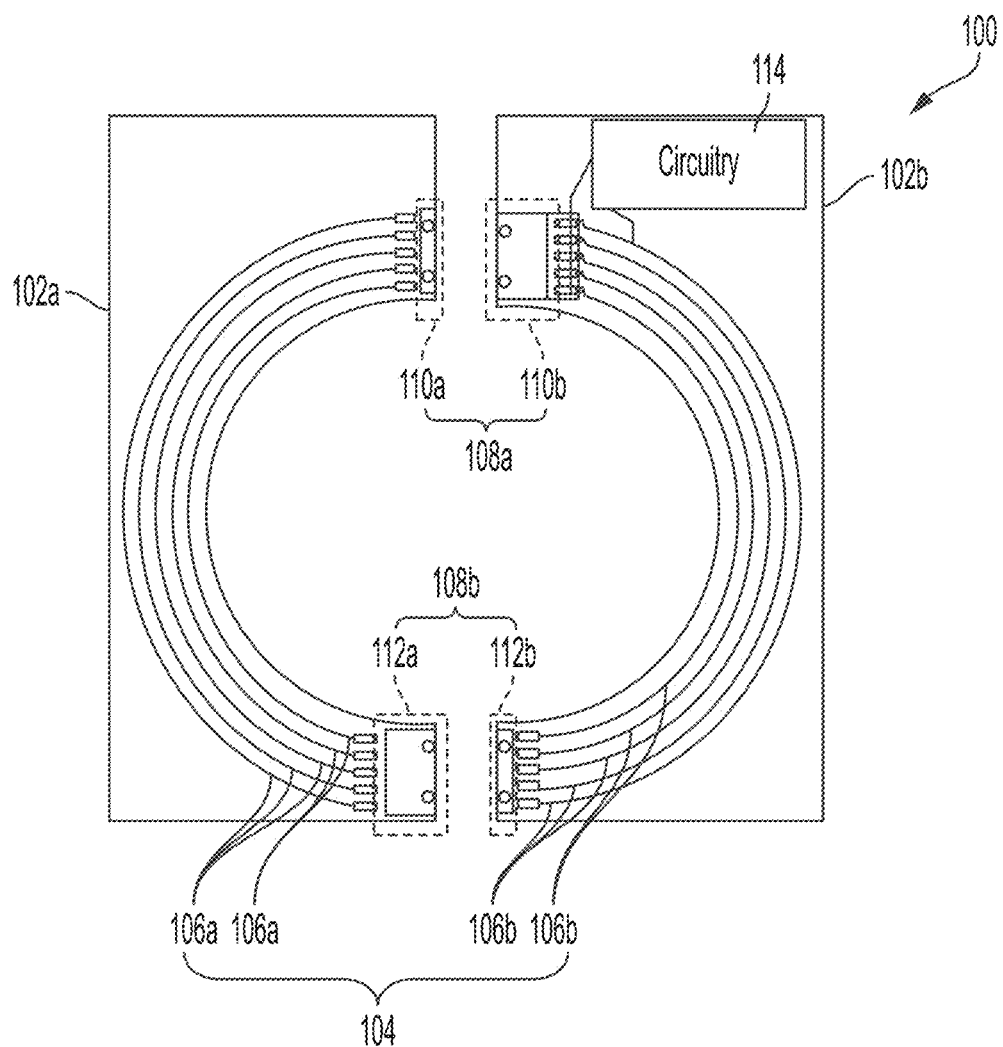
FIG. 1A illustrates two pieces of an axial magnetic flux sensor in a separated state, according to a non-limiting embodiment of the present application.

FIG. 1A illustrate two pieces of an axial magnetic flux sensor in a separated state, according to a non-limiting embodiment of the present application. The axial magnetic flux sensor 100 comprises a first substrate 102a and second substrate 102b, in a separated state. The axial magnetic flux sensor includes conductive traces 104, including a first plurality of conductive traces 106a on the first substrate 102a and a second plurality of conductive traces 106b on the second substrate 102b. The axial magnetic flux sensor 100 further comprises a first trace connector 108a and a second trace connector 108b. The first trace connector 108a comprises a first portion 110a on the first substrate 102a and a second portion 110b on the second substrate 102b. The second trace connector 108b comprises a first portion 112a on the first substrate 102a and a second portion 112b on the second substrate 102b. The axial magnetic flux sensor 100 further comprises circuitry 114 electrically coupled to the conductive traces 104 and in particular, in this non-limiting example, coupled to the second plurality of conductive traces 106b.

The first substrate 102a and second substrate 102b may be any suitable types of substrates. In some embodiments, both are printed circuit boards (PCBs). Other materials may be used, however, so long as they can support conductive traces or conductive paths.

Figure 1B:
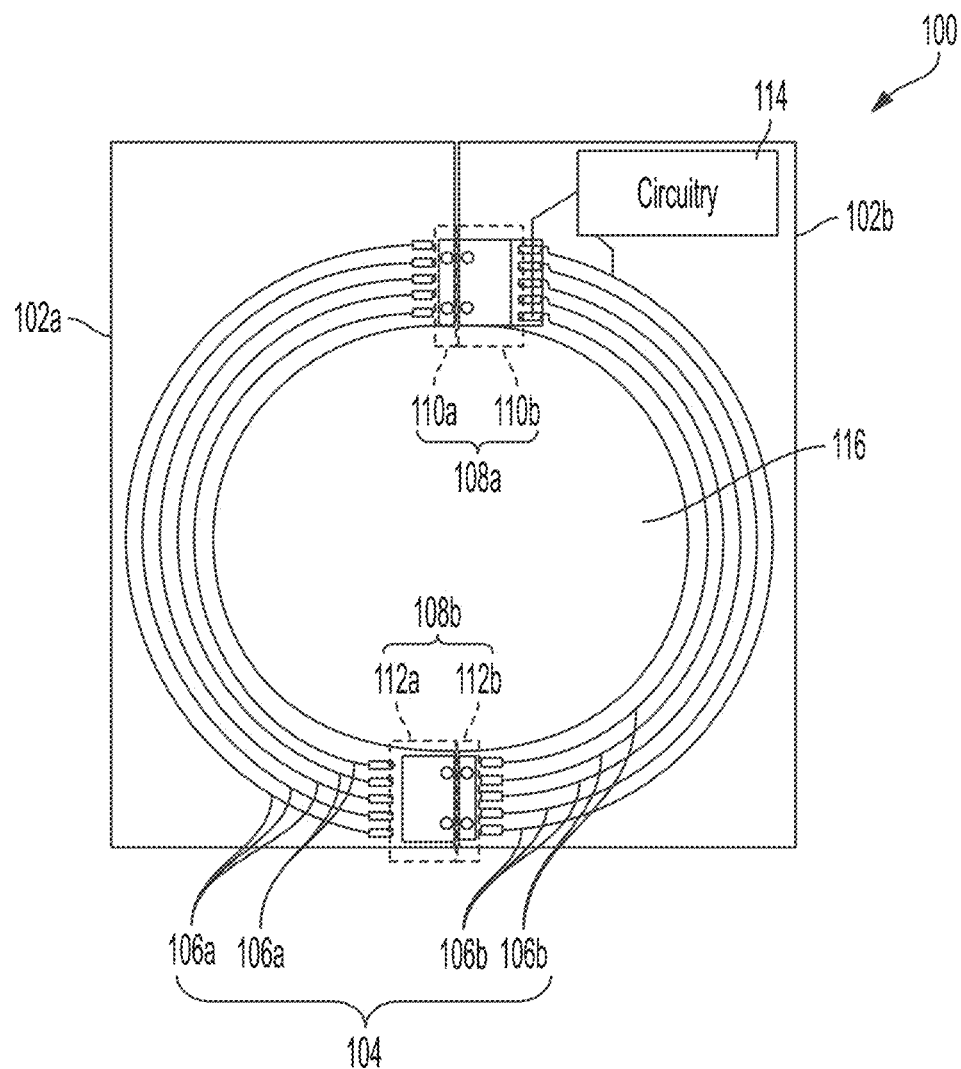
FIG. 1B illustrates the axial magnetic flux sensor of FIG. 1A in a state in which the two pieces of the sensor are coupled together, according to a non-limiting embodiment application.

The first substrate 102a and second substrate 102b can have any suitable shape to allow the axial magnetic flux sensor to sense an axially oriented magnetic flux. In the non-limiting example of FIGS. 1A and 1B, they are shaped so that when coupled together, as shown in FIG. 1B, an opening 116 exists, which can accommodate a motor shaft or other piece of machinery. Also, the substrate 102b is shaped so that it can support circuitry 114. For instance, the substrate 102b has sufficient space to the side of the second plurality of conductive traces that circuitry can be placed there.

The axial magnetic flux sensor 100 includes two substrates 102a and 102b, but other numbers of substrates may be used. For example, three substrates (e.g., sized to individually represent approximately one-third of a circle), four substrates (e.g., sized to individually represent approximately one-quarter of a circle), or other suitable numbers may be used. The use of two substrate is sufficient in at least some embodiments to enable a closed loop of conductive traces to be formed, as shown in FIG. 1B, by positioning the substrates around a motor shaft or other piece of equipment. The use of a larger number of substrates may increase complexity of the sensor but may in some situations facilitate fitting the substrates around a piece of machinery to be monitored.

As shown in FIG. 1B, the first substrate 102a and second substrate 102b may be coupled together in a manner that forms a closed loop with the opening 116. The first plurality of conductive traces 106a and the second plurality of conductive traces 106b are partial loop conductive traces. The first plurality of conductive traces 106a and the second plurality of conductive traces 106b may couple together to form a single, continuous, multi-loop coil. The coil is substantially planar in some embodiments. As will be described further below in connection with FIGS. 2A and 2B, the first trace connector 108a and second trace connector 108b facilitate coupling the first plurality of conductive traces 106a and second plurality of conductive traces 106b into a single multi-loop coil.

The first plurality of conductive traces 106a and the second plurality of conductive traces 106b may include any suitable number of conductive traces to provide a desired sensitivity for detecting axial magnetic flux. The greater the number of conductive traces the greater the sensitivity. However, there may be a practical limit to how many traces can fit on the substrate. In the examples of FIGS. 1A-B, 2A-B, 4A-B and 9A, each of the conductive traces is located in close proximity to a low-noise amplifier of the circuitry. The local amplification reduces the number of loops required. For example, a local amplifier providing a gain of approximately 30 may reduce the number of loops needed to generate an equivalent magnitude signal by a factor of 30. This in turn simplifies the trace connectors and substrate design. Generally, then, the local amplification reduces design complexity and cost, and allows for smaller size of the overall axial magnetic flux sensor. In the illustrated example, each of the first and second pluralities of conductive traces includes five conductive traces. In alternative embodiments, fewer or more may be used.

The first plurality of conductive traces and second plurality of conductive traces may be substantially planar. As described herein, the sensors may be used to detect axial magnetic flux oriented through the coil formed by connecting the first plurality of conductive traces and second plurality of conductive traces. Have the conductive traces assume a substantially planar shape allows for inducing a current in the conductive traces when the magnetic flux is oriented through the coil.

The conductive traces 104 may be formed of any suitable conductive material. As explained above, in some embodiments the first substrate 102a and second substrate 102b are PCBs. In such embodiments, the conductive traces 104 may be traces on the PCBs. However, not all embodiments are limited in this respect. For example, wires may be used as the conductive traces 104 in some embodiments.

The conductive traces 104 may assume any suitable shape. In some embodiments, such as that illustrated in FIG. 1B, it may be desirable for the conductive traces when coupled together to form substantially circular loops. Thus, in some embodiments the first plurality of conductive traces 106a and the second plurality of conductive traces 106b are shaped as semi-circles. However, not all embodiments are limited in this respect, as non-circular (e.g., oval) loops may instead be formed by connecting the first and second pluralities of conductive traces. The pluralities of conductive traces may therefore be semi-circles, partial loops, curved segments, or assume other shapes.

The first trace connector 108a and second trace connector 108b may be various types of electrical connectors suitable for connecting the conductive traces 104 on the substrates 102a and 102b. One example, illustrated in FIGS. 2A and 2B and described further below in connection with those figures, is that the trace connectors 108a and 108b may be pin and socket connectors. Other types of pluggable or de-couplable trace connectors may be used in alternative embodiments. The first trace connector 108a and second trace connector 108b may be configured suitably to couple the first plurality of conductive traces 106a and second plurality of conductive traces 106b into a single, continuous, multi-loop coil. The single, continuous, multi-loop coil is substantially planar in some embodiments. In some embodiments, that means that one of the two trace connectors may couple the first and second pluralities of conductive traces in a one-to-one relationship, and the other of the trace connectors may not. A detailed example is illustrated in FIGS. 2A and 2B and described further below in connection with those figures.

Figure 3:
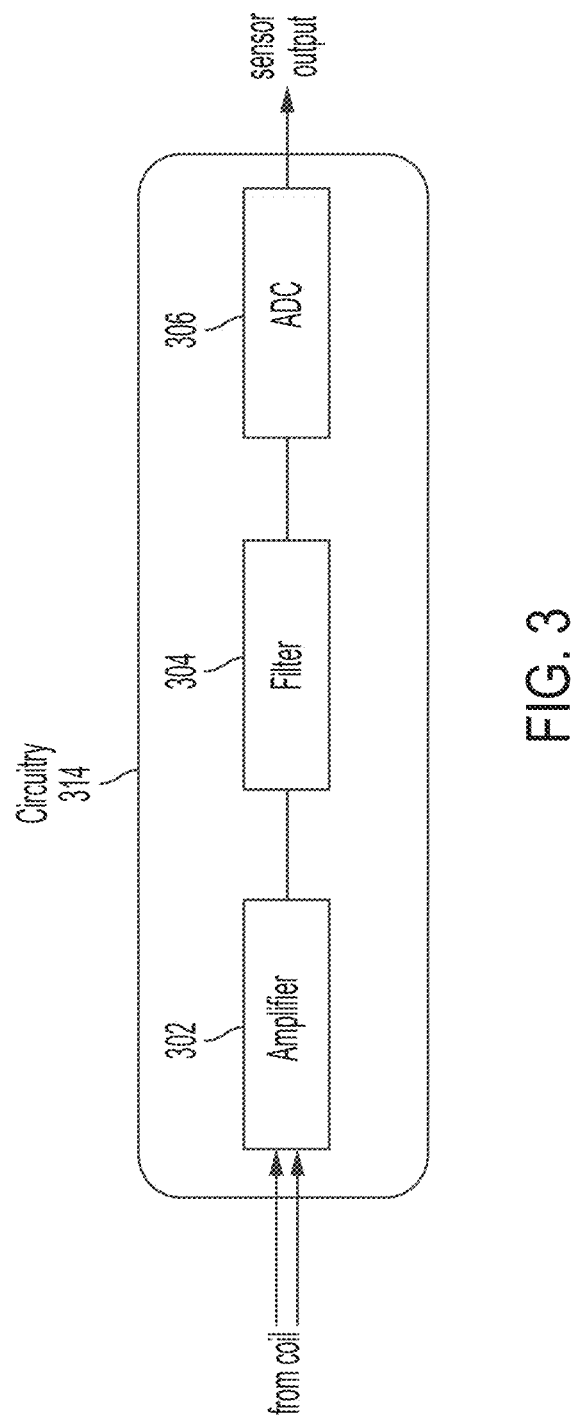
FIG. 3 illustrates an example of the circuitry of the axial magnetic flux sensors of FIGS. 1A and 2A, according to a non-limiting embodiment of the present application.

The circuitry 114 of FIGS. 1A and 1B is coupled to the second plurality of conductive traces 106b in the illustrated example and configured to receive the signal generated in the coil—formed when the first and second pluralities of conductive traces are coupled—in response to magnetic flux passing through the opening 116. The circuitry may include a low-noise amplifier and optionally an analog-to-digital converter (ADC). A non-limiting example of the circuitry 114 is illustrated in FIG. 3 and described further below in connection with that figure. It should be appreciated that the circuitry 114 may in alternative embodiments be on the substrate 106a and coupled to the first plurality of conductive traces 106a. In alternative embodiments, some circuitry may be on substrate 106a and some circuitry on substrate 106b.

To use the axial magnetic flux sensor 100, the first and second substrates 102a and 102b may be coupled together as shown in FIG. 1B. The coupled first and second substrates 102a and 102b may be coupled around the shaft of a motor or other piece of machinery, using the first and second trace connectors 108a and 108b, clamps, or any other suitable coupler. Axial magnetic flux from the machine may pass through the opening 116, generating a current in the conductive traces 104. The circuitry 114 may detect the current and generate an output signal. The output signal may be an indication of the current, may be an indication of the state of health of the machinery, or may be any other suitable signal.

Figure 2A:
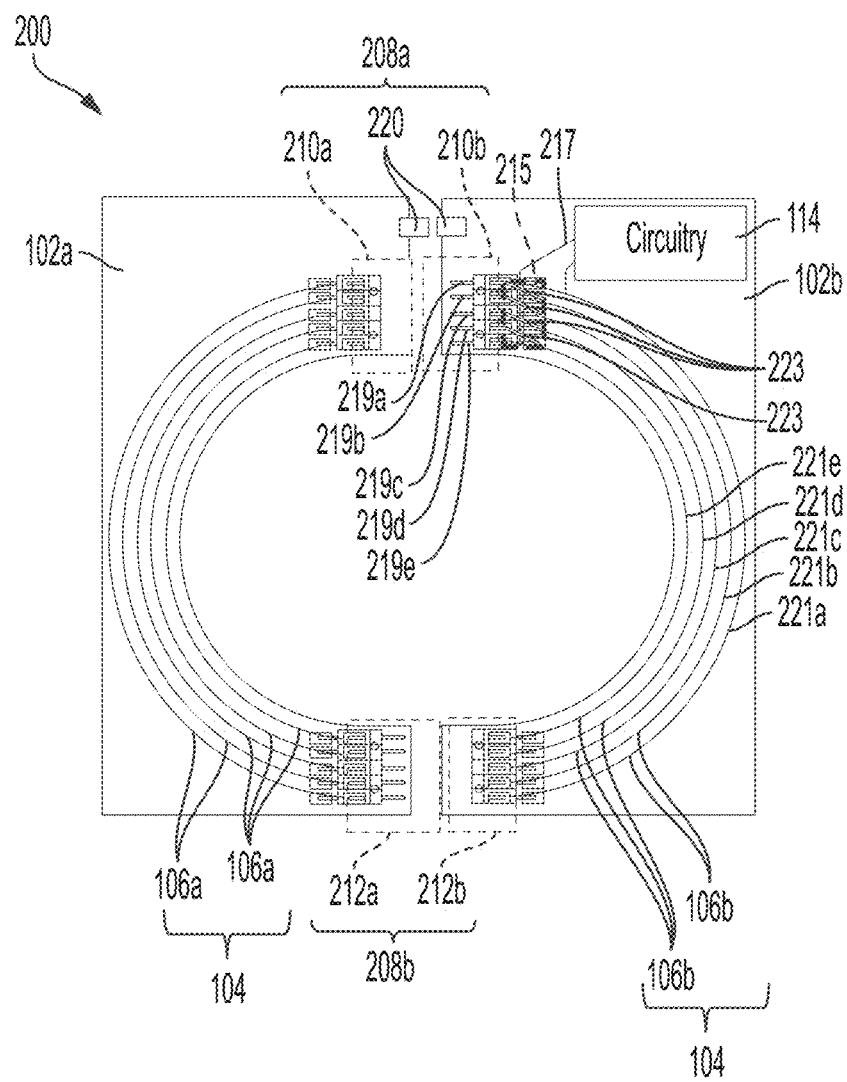
FIG. 2A illustrates an example implementation of the axial magnetic flux sensor of FIG. 1A in a separated state, showing an example implementation of a trace connector, according to a non-limiting embodiment of the present application.
Figure 2B:
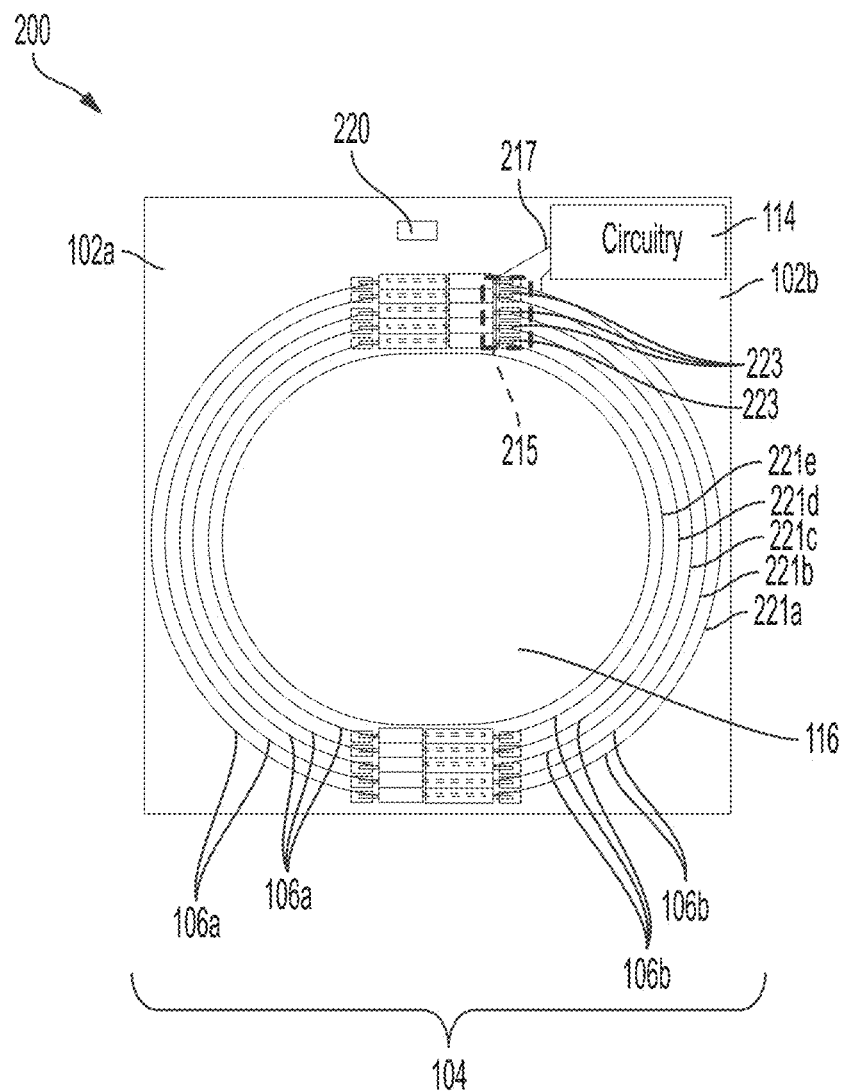
FIG. 2B illustrates the axial magnetic flux sensor of FIG. 2A in a state in which the two pieces of the sensor are coupled together, according to a non-limiting embodiment of the present application.

FIG. 2A illustrates an example implementation of the axial magnetic flux sensor of FIG. 1A in a separated state, showing an example implementation of a trace connector, according to a non-limiting embodiment of the present application. Many of the components in FIG. 2A are the same as in FIG. 1A, as identified by the same reference numbers, and therefore are not described in detail now. The axial magnetic flux sensor 200 comprises a first trace connector 208a and a second trace connector 208b, which are non-limiting examples of the implementation of first trace connector 108a and second trace connector 108b of FIG. 1A, respectively. The first trace connector 208a comprises a first portion 210a on the first substrate 102a and a second portion 210b on the second substrate 102b. The second trace connector 208b comprises a first portion 212a on the first substrate 102a and a second portion 212b on the second substrate 102b. In addition, the axial magnetic flux sensor 200 comprises a bridge trace array 215 and a bypass trace 217.

The first trace connector 208a and the second trace connector 208b are pin and socket connectors in this non-limiting example. The first portion 210a is a receptable portion of the pin and socket connector. The second portion 210b is a plug portion of the pin and socket connector. Similarly, the first portion 212a is a plug portion of the pin and socket connector. The second portion 212b is a receptacle portion of the pin and socket connector.

In the example of FIG. 2A, the first trace connector 208a and second trace connector 208b differ from each other in terms of how they connect to the conductive traces 104 so that, when connected, the first plurality of conductive traces 106a and the second plurality of conductive traces 106b form a single, continuous, multi-loop coil. The second trace connector 208b connects the first plurality of conductive traces 106a and the second plurality of conductive traces 106b in a one-to-one relationship. The first trace connector 208a does not. Instead, the second portion 210b of the first trace connector 208a connects fewer than all—in this case, four—of the second plurality of conductive traces 106b to the first plurality of conductive traces 106a. The pins 219a, 219b, 219c, and 219d connect one of the conductive traces of the second plurality of conductive traces 106b to a conductive trace of the first plurality of conductive traces 106a. However, it can be seen from FIGS. 2A and 2B that the pins 219a-219d do not connect to the corresponding conductive trace of the second plurality of conductive traces 106b. For instance, although pin 219a is the outermost pin, it does not connect to the outermost conductive trace 221a, but instead connects to the second outermost conductive trace 221b. Likewise, pin 219b connects to the middle conductive trace 221c. Pin 219c connects to the second innermost conductive trace 221d. Pin 219d connects to the innermost conductive trace 221e. These connections are made by a bridge trace array 215, which includes respective individual traces 223 that bridge the offset between the pins 219a-219d and the conductive traces to which they connect. The outermost conductive trace 221a connects to circuitry 114. Likewise, the pin 219e—in this case, the innermost pin 219e of the second portion 210b—is coupled to the circuitry 114 by a bypass trace 217 that bypasses the second plurality of conductive traces 106b. The illustrated configuration of the connections made by the second portion 210b to the circuitry 114 and the second plurality of conductive traces 106b allows for the first trace connector 208a and second trace connector 208b to couple the first plurality of conductive traces 106a and second plurality of conductive traces 106b into a single, continuous, multi-loop coil.

The bridge trace array 215 may take any suitable form for effecting the coupling of pins of the second portion 210b with the second plurality of conductive traces 106b. In the illustrated example, bridge trace array 215 comprises traces 223 oriented at an angle relative to the second plurality of conductive traces 106b. Other configurations are possible.

The bypass trace 217 may take any suitable form for connecting the pin 219e to the circuitry 114 without contacting the second plurality of conductive traces 106b. In some embodiments, the bypass trace 217 may be on a different layer of the substrate 102b than the second plurality of conductive traces 106b. For example, the bypass trace 217 may be on a backside of the substrate 102b in some examples. When the substrate 102b is a PCB, the bypass trace 217 may be implemented as a middle-level conductive layer of the PCB, whereas the second plurality of conductive traces may be implemented as an uppermost conductive layer of the PCB. Other configurations are also possible. According to a non-limiting example, the amplifier of circuitry 114 may be located in close proximity to conductive traces 106b. One benefit of having the amplifier close to the conductive traces is a reduction in parasitic electromagnetic pickup in the traces connecting the conductive traces 106b and an amplifier of the circuitry (e.g., bypass trace 217).

FIG. 2B illustrates the axial magnetic flux sensor of FIG. 2A when the two pieces of the sensor are coupled together, according to a non-limiting embodiment of the present application. In this state, the first plurality of conductive traces 106a and the second plurality of conductive traces 106b are coupled into a single, continuous, multi-loop coil. Passage of a magnetic flux through the opening 116 generates a current in the continuous, multi-loop coil that can be detected by the circuitry 114.

Any suitable manner may be used to couple the substrates of the sensor together. In some embodiments, the trace couplers may be sufficient for holding the substrates together. In other embodiments, additional couplers may be provided for enhanced stability of the coupling. For example, clamps, magnetic couplers, or other coupling mechanisms may be employed. In the example of FIG. 2B, a clamp 220 is included to couple the substrates together. More than one clamp may be used in some embodiments.

FIG. 3 illustrates an example of the circuitry 114 of the axial magnetic flux sensors of FIGS. 1A and 2A, according to a non-limiting embodiment of the present application. The circuitry 314 includes an amplifier 302, a filter 304, and an ADC 306. Other configurations, including additional or fewer components than those illustrated, may be included in alternative embodiments.

The amplifier 302 is coupled to the output of the continuous, multi-loop coil as described previously in connection with FIGS. 1B and 2B. That is, both ends of the coil feed the amplifier 302. In general, the more loops making up the coil, the greater the magnitude of the signal that will be generated by magnetic flux passing through the opening 116. However, when axial magnetic flux sensors are implemented as traces on substrates, such as shown in FIGS. 1B and 2B, there may be practical limitations to how many loops can be formed, and that number may be inadequate to generate a signal with a desired magnitude. Five loops, as shown in FIGS. 1B and 2B, may be sufficient to generate a desired signal magnitude in some applications but may be insufficient for other applications. Thus, the number of loops may be selected for an intended application in some embodiments. The amplifier 302 provides a desired level of amplification to make the signal from the loop usable. Because the signal magnitude from the coil may be relatively small, the amplifier 302 may be a low noise amplifier (LNA) in at least some embodiments. In that manner, significant amplification may be achieved without adding significant noise to the signal. The amplifier 302 may provide a gain between ten and one hundred, between twenty and fifty, between twenty-five and forty, or any gain or range of gains within those ranges. In some embodiments, the magnitude of the signal from the coil may be on the order of nanoVolts or microVolts, and thus a gain within the ranges listed above may increase the signal magnitude to a level that is more usable.

The filter 304 is optional. When included, the filter 304 may be coupled to receive and filter an amplified signal from the amplifier 302. The filter 304 may be any suitable type of filter for removing unwanted signal. For example, the filter may be a low pass filter, a bandpass filter, or a high pass filter. The filter may be constructed to isolate signals at a frequency corresponding to an anticipated frequency of operation of the machinery being monitored. For example, if the axial flux sensor is being used to monitor a machine with a rotation rate of 60 Hz, filter 304 may be used to isolate signals at approximately that frequency. However, other forms of filtering may be performed in other embodiments.

The ADC 306 is also optional. In some embodiments, the ADC 306 is included on the substrate 102b to digitize the signal from the coil. Optionally, further digital processing circuitry may be provided on the substrate 102b downstream of the ADC 306. Such digital processing circuitry may include filtering or other digital circuitry. In some embodiments, the ADC 306 is omitted from the circuitry 314 on the substrate 102b. The axial magnetic flux sensor may output an analog signal, and any digitization may be performed off the sensor, for example in a separate processor.

Figure 4A:
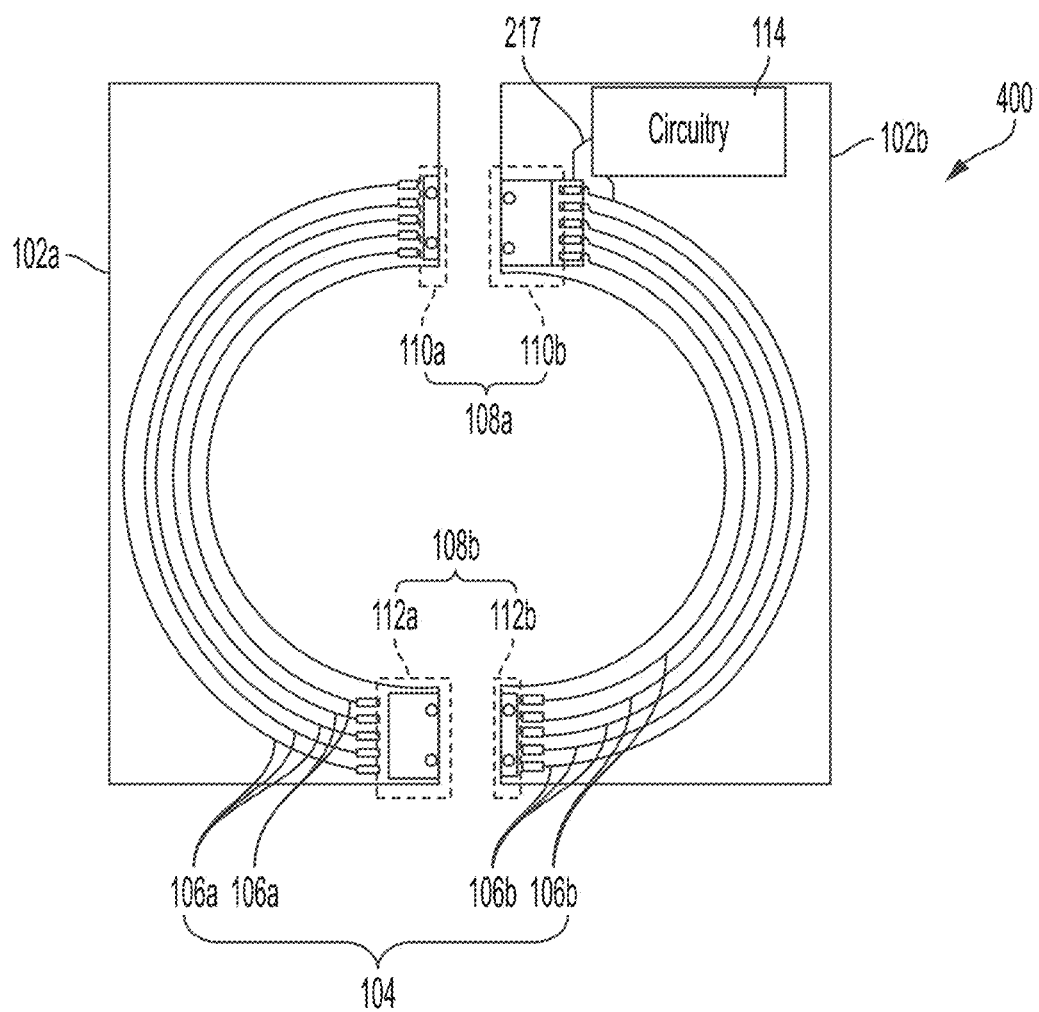
FIG. 4A illustrates a first side of an axial magnetic flux sensor, which includes the same components as the axial magnetic flux sensor of FIG. 1B on one side of the substrates.
Figure 4B:
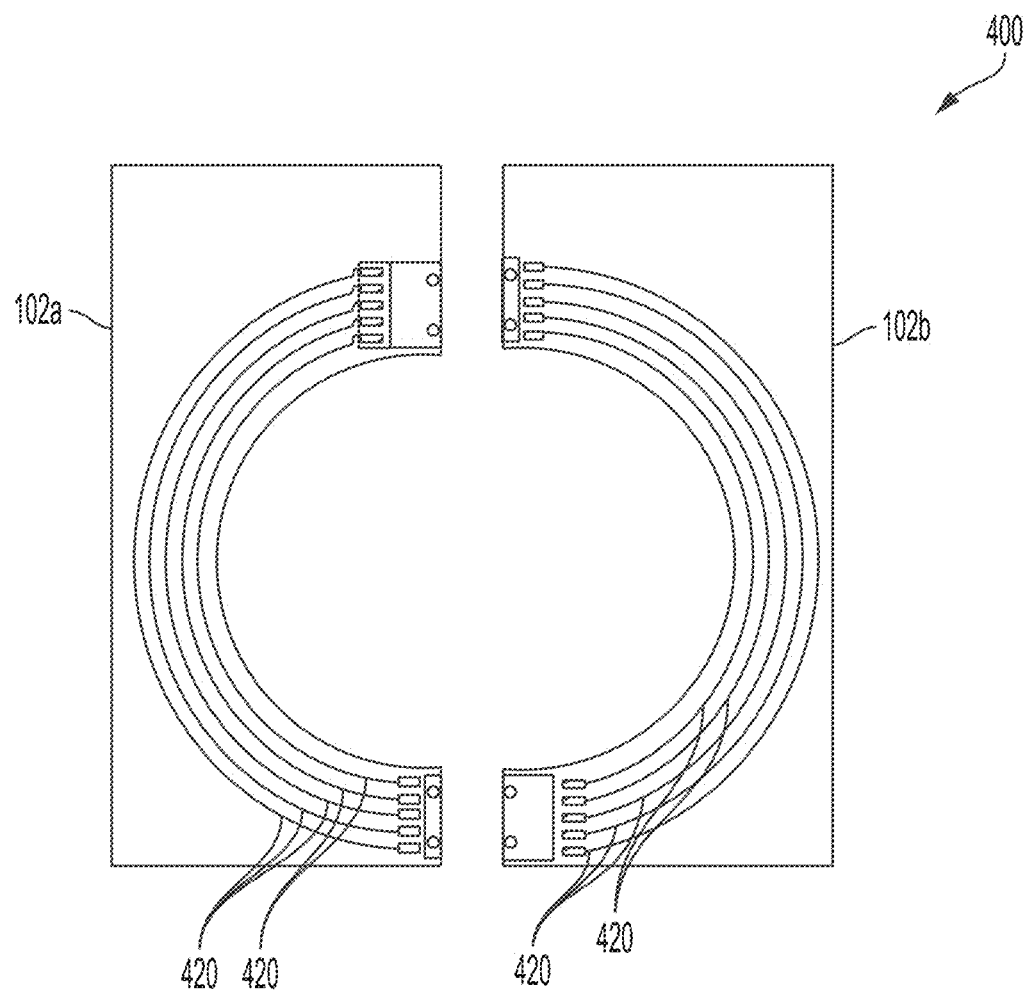
FIG. 4B illustrates a backside of the axial magnetic flux sensor of FIG. 4A.

According to an aspect of the present application, an axial magnetic flux sensor assembled by coupling of multiple substrates having conductive traces thereon includes conductive traces on both sides of the substrate(s). FIGS. 4A and 4B illustrate a non-limiting example. FIG. 4A illustrates a first side of an axial magnetic flux sensor 400, which includes the same components as axial magnetic flux sensor 100 of FIG. 1B on one side of the substrates 102a and 102b. However, axial magnetic flux sensor 400 additionally includes conductive traces on the opposite side of the substrates, as shown in FIG. 4B.

FIG. 4B illustrates a backside of the axial magnetic flux sensor 400. Conductive traces 420 form part of the single, continuous, multi-loop coil of the axial magnetic flux sensor. That is, the conductive traces on the backside connect to the conductive traces on the front side (FIG. 4A) of the substrates 102a and 102b, effectively lengthening the coil and increasing the number of loops of the coil. Such a configuration will provide a greater electrical signal output from the coil for a given axial magnetic flux than would a substantially equivalent sensor having only the conductive traces on one side of the substrates 102a and 102b.

The conductive traces shown in FIGS. 4A and 4B may be coupled together in any suitable manner to form a single loop. For example, a plug, via, conductive post, or other conductive structure may connect the conductive traces on the two sides of the substrates together. If the substrates are PCBs, conductive vias may run between the front and backside of the PCBs. The conductive vias may be formed by electroplating holes in the PCB, or in any other suitable manner.

According to an aspect of the present application, the axial magnetic flux sensor may comprise trace connectors on both sides of the substrate(s). Additional trace connectors on, for example, the backside of axial magnetic flux sensor 400 may increase the density of loops and increase rigidity of the sensor.

Figure 5:
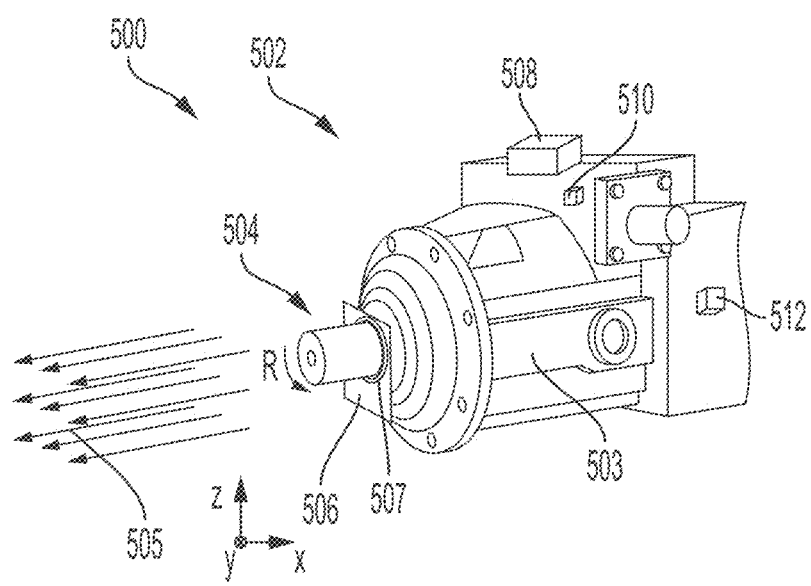
FIG. 5 illustrates a non-limiting example of an axial magnetic flux sensor configured to monitor the operation of machinery according to a non-limiting embodiment.

As has been described above, the axial magnetic flux sensors described herein may be used to monitor the operation of machinery. FIG. 5 illustrates a non-limiting example. The system 500 includes a motor 502 having a shaft 504, and an axial flux sensor 506. Optionally, additional sensors 508, 510, and 512 may be included.

The motor 502 may be any suitable type of motor. Moreover, the motor 502 is a non-limiting example of a piece of machinery which may be monitored with an axial magnetic flux sensor. The motor 502 has a housing 503, and the shaft 504 which extends from inside the housing to outside the housing. The shaft may rotate, for example in the direction indicated by the arrow R. Although not shown for purposes of simplicity of the illustration, the shaft 504 may connect to other machinery at its end opposite the motor, meaning that the ends of the shaft 504 may not be accessible without taking apart the motor or a piece of equipment connected to the motor. Thus, an axial magnetic flux sensor of the types described may be beneficial in allowing placement of the sensor around the shaft without the need to remove equipment.

The axial magnetic flux sensor 506 may be any of the axial magnetic flux sensors described in the present disclosure. The axial magnetic flux sensor 506 is shown as having a coil 507, which may be any of the types of coils described herein. As shown, the axial magnetic flux sensor 506 is disposed around the shaft 504 outside the housing 503. The motor may generate a net axial magnetic field 505 outside the housing 503. Note that within the housing there may be no net axial magnetic field. The axial magnetic field 505 passing through the opening of the axial magnetic flux sensor 506 generates a current in the coil 507 of the axial magnetic flux sensor. The current may be processed to determine a characteristic of the axial magnetic field, such as its magnitude, frequency, or other characteristic of interest. The operation and/or health of the motor 502 may be determined as a result. For example, if the axial magnetic field is too large, too small, deviates too greatly from a baseline value, is characterized by an atypical frequency, or otherwise indicative of abnormal or deteriorating operation of the motor 502, corrective action may be taken. For example, maintenance or replacement of the motor 502 may be performed prior to failure. Machine downtime can therefore be controlled and reduced to the extent possible.

In some embodiments, machine health monitoring of the motor 502 may involve analyzing more than just the axial magnetic field 505. For example, vibration, sound, stator current, shaft current, and/or radial magnetic flux may be monitored as well, and the results of all monitoring may be evaluated to assess the health of the motor 502. Sensors 508, 510, and 512 may thus be optionally provided. Those sensors may be any combination of accelerometers, gyroscopes, microphones, or other suitable sensors. Although the axial magnetic flux sensor 506 and the sensors 508, 510, and 512 are illustrated as being separate, in some embodiments a single sensor housing including various types of sensors may be provided and positioned suitably with respect to the motor 502. That is, aspects of the present application provide a machine health monitoring sensor of which one component is an axial magnetic flux sensor of the types described herein.

Figure 6:
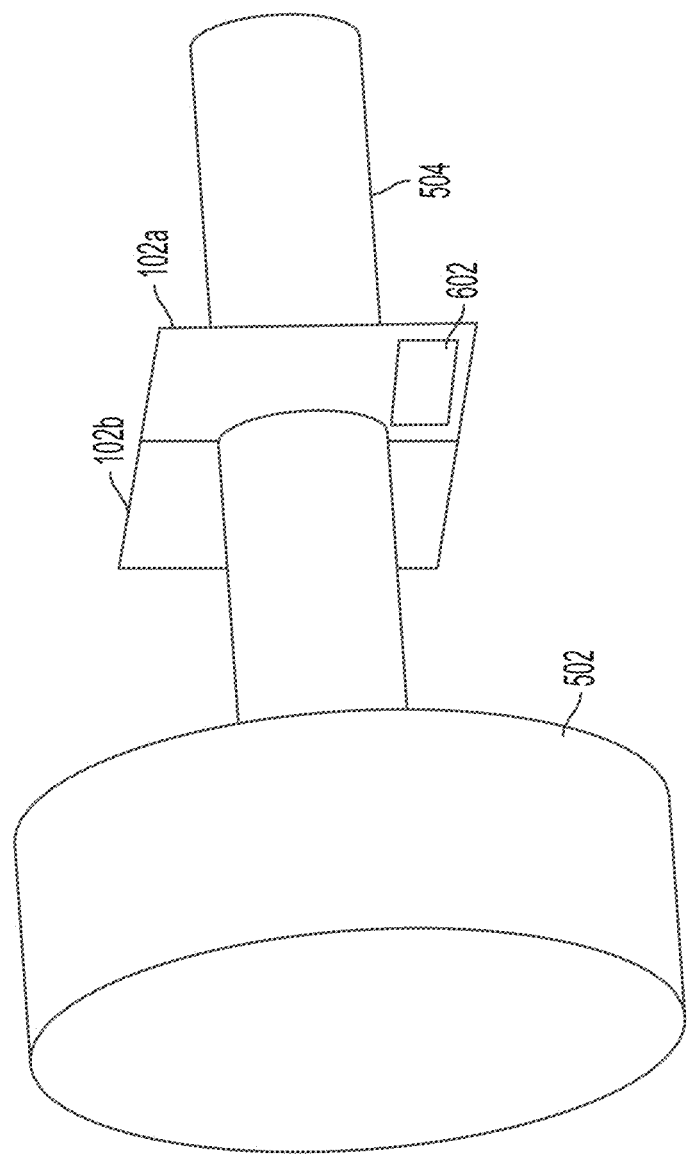
FIG. 6 illustrates a non-limiting example of one manner of coupling an axial magnetic flux sensor to a motor.

The axial magnetic flux sensor 506 may be coupled to the motor in any suitable manner to allow for detection of the axial magnetic flux. FIG. 6 illustrates a non-limiting example of one manner of coupling an axial magnetic flux sensor to a motor. The motor 502 is shown in simplified form. The axial magnetic flux sensor has a magnet 602 on a backside of the substrate 102a. The magnet may couple to the outside of the housing of a motor or other piece of machinery to be monitored, such as motor 502. In that manner, the axial magnetic flux sensor may be fixed in position without contacting the shaft around which it is placed. As alternatives to a magnet, an adhesive, clamp, hook and loop fastener, or other coupling mechanism may be used to fix the axial magnetic flux sensor to machine being monitored.

Figure 7:
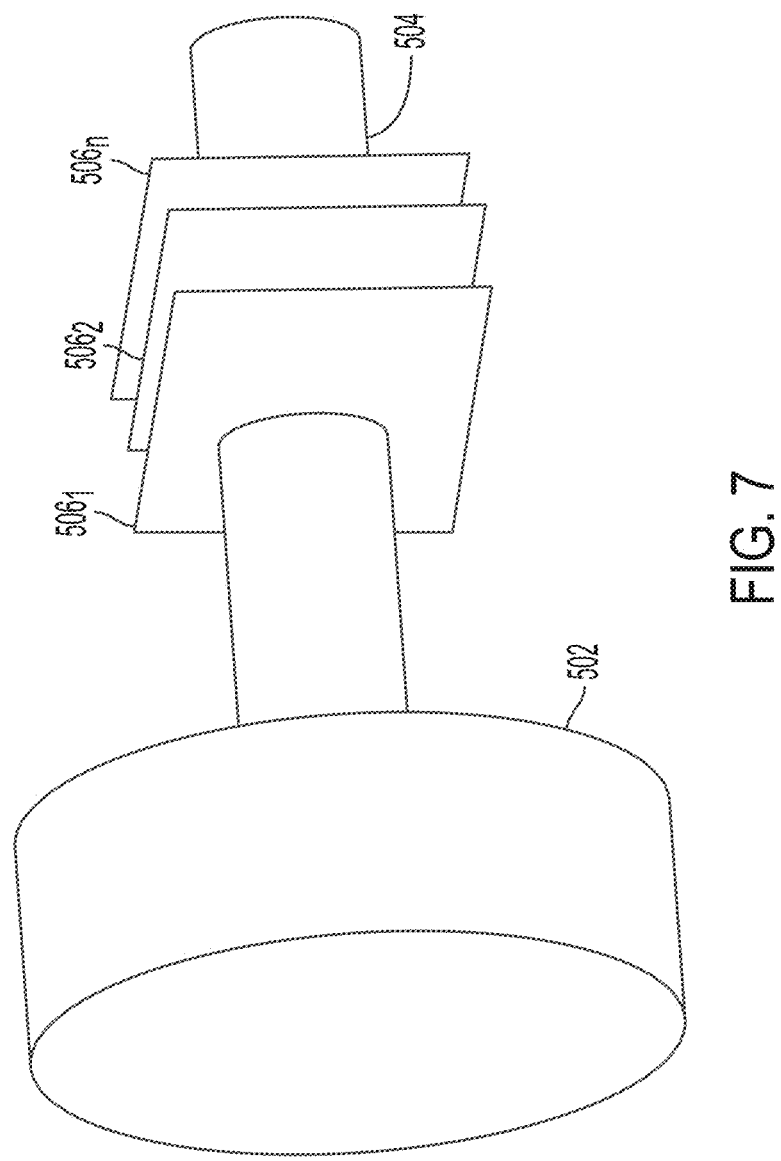
FIG. 7 illustrates multiple substrates comprising conductive coils, with the substrates stacked together to monitor the axial magnetic flux of a piece of equipment.

According to an aspect of the present application, multiple substrates comprising conductive coils may be stacked together to monitor the axial magnetic flux of a piece of equipment. FIG. 7 illustrates a non-limiting example. As shown, multiple instances 506₁, 506₂ . . . 506ₙ of the axial magnetic flux sensor 506 are positioned around the shaft 504 of the motor 502. The motor 502 is shown in simplified form. Including multiple instances of the axial magnetic flux sensor provides enhanced monitoring capability. For example, the signals from the coils may be summed together to provide an amplified signal compared to what a single instance of the axial magnetic flux sensor can provide.

When multiple instances of the axial magnetic flux sensor are provided, they may be coupled together in any suitable manner. For example, posts, rods, pins, or other connectors may couple the axial magnetic flux sensors together. In combination, the multiple instances of the axial magnetic flux sensor may be considered a single axial magnetic flux sensor having stacked substrates.

Figure 8:
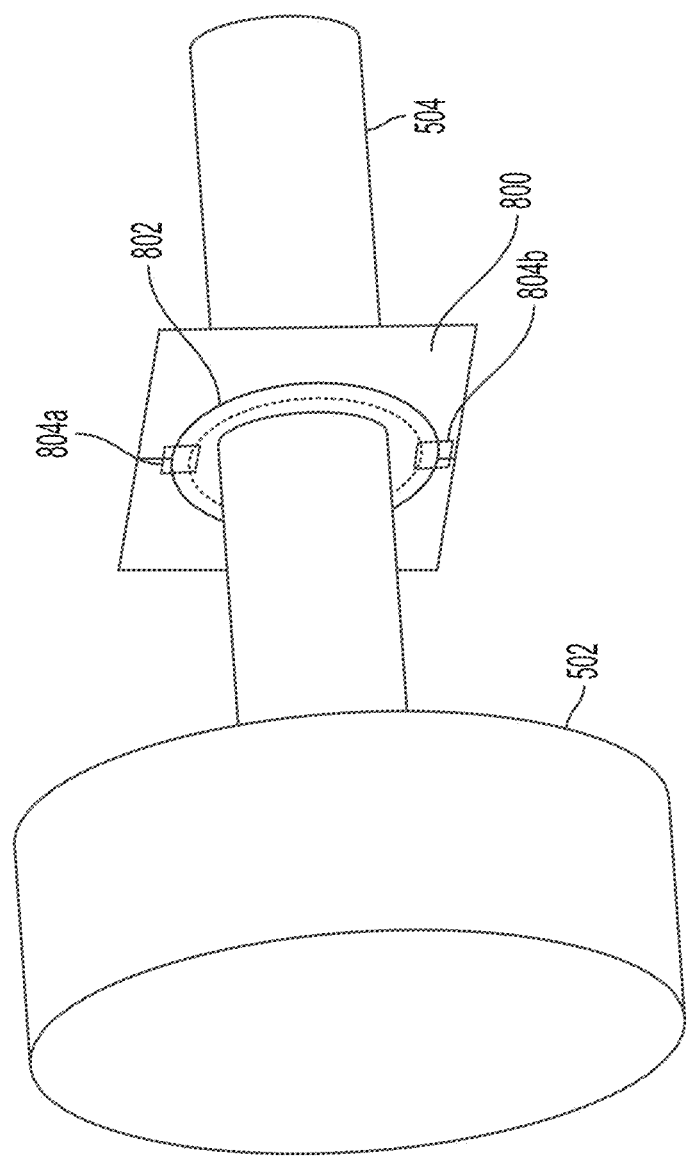
FIG. 8 illustrates a multi-wire cable connectable around a shaft of a motor in such a manner as to form a single, continuous, multi-loop coil.

According to an aspect of the present application, a multi-wire cable is connectable around a shaft of a motor in such a manner as to form a single, continuous, multi-loop coil. For example, a single cable sheath housing multiple, isolated conductive cores may be used in some embodiments. The single, continuous, multi-loop coil may operate in the manner described previously herein with respect to the preceding embodiments of axial magnetic flux sensors, to detect axial magnetic flux. By having a single sheath housing the conductors, such as with a ribbon cable, the cable would need to be wrapped around the machinery being monitored only once in some embodiments. FIG. 8 illustrates a non-limiting example of a multi-wire cable suitable for wrapping around a piece of machinery to monitor axial magnetic flux.

The axial magnetic flux sensor 800 comprises a cable 802 with connectors 804a and 804b. The cable 802 comprises a plurality of wires. The connectors 804a and 804b couple the plurality of wires to form a single, continuous, multi-loop coil. For example, the connectors 804a and 804b may be configured like the first trace connector 208a of FIG. 2B. The connectors 804a and 804b allow for forming the coil around the shaft of the motor 502 (which is shown in simplified form). The cable may be fixed in place in any suitable manner so as not to contact the shaft 504. For example, the cable may be mounted to a substrate, tube, or other rigid structure to ensure it maintains a loop shape without contacting the shaft 504.

Figure 9A:
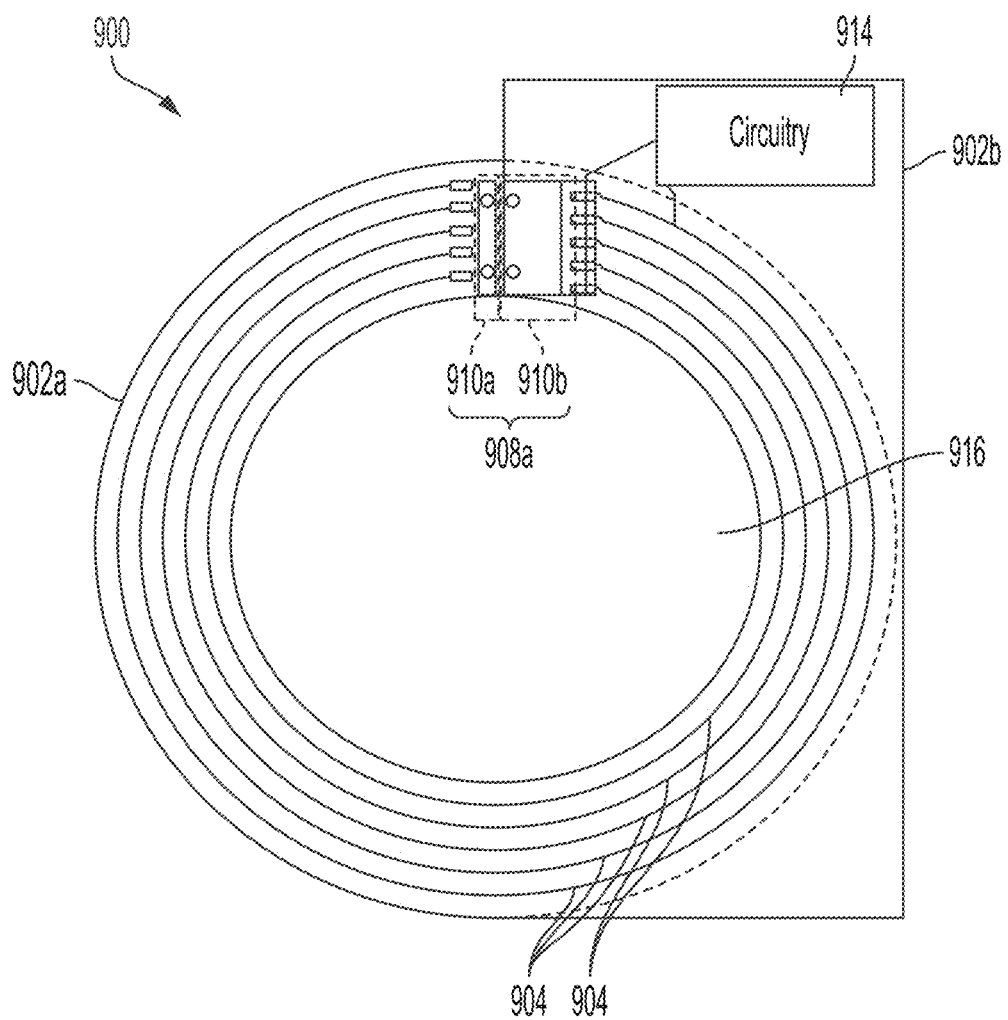
FIG. 9A illustrates an example implementation of an axial magnetic flux sensor on a rigid-flex printed circuit board (PCB), according to a non-limiting embodiment of the present application.
Figure 9B:
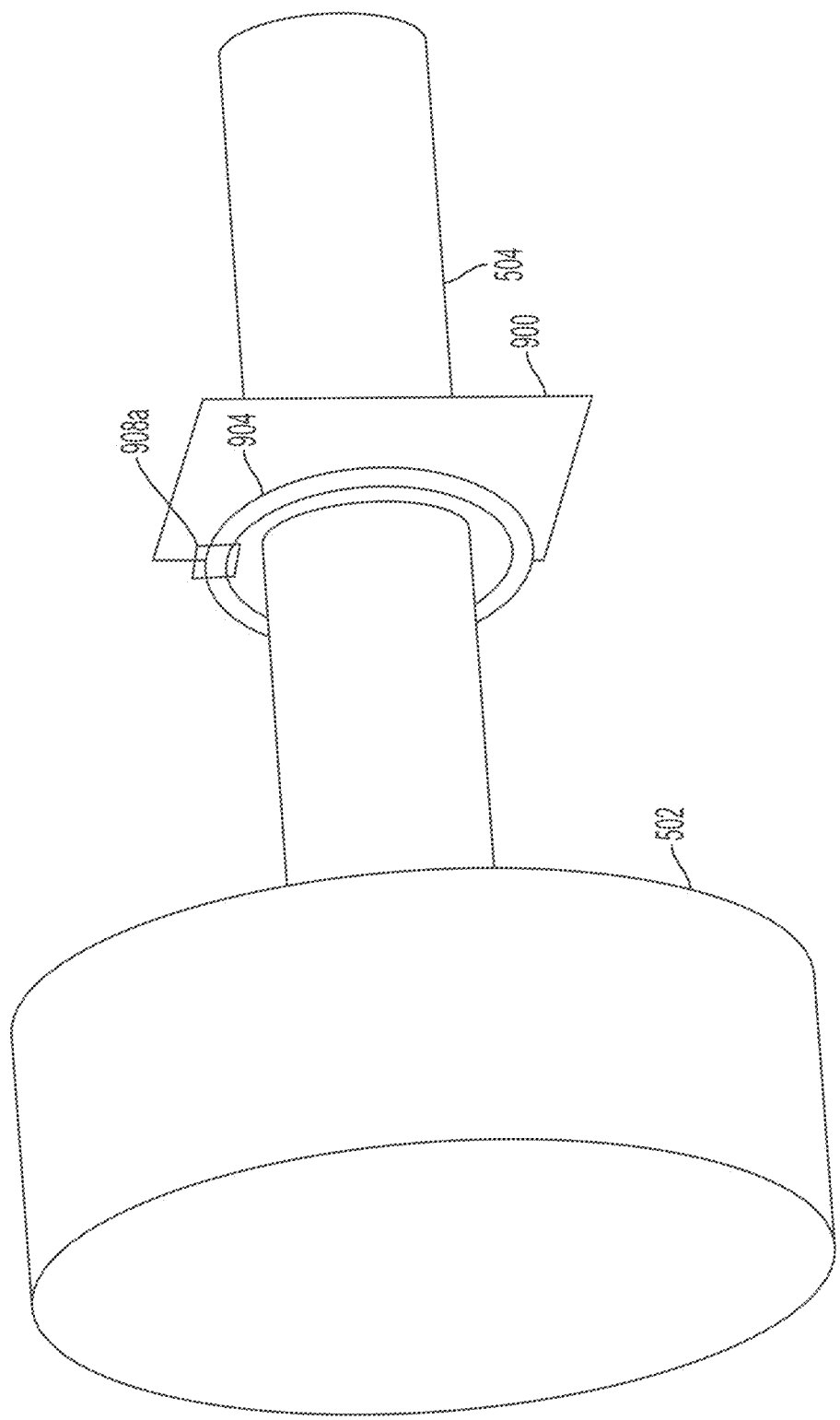
FIG. 9B illustrates a non-limiting example of one manner of coupling the axial magnetic flux sensor of FIG. 9A to a motor.

According to an aspect of the present application, an axial magnetic flux sensor may comprise a single trace connector to couple together conductive traces into a single, continuous multi-loop coil. In some embodiments, such a configuration comprises a single substrate with a plurality of conductive traces partially on the substrate and partially off the substrate, and configured to be connected in a loop. According to an aspect of the present application, an axial magnetic flux sensor comprises a single substrate with conductive traces. The single substrate may be any suitable type of substrate. In some embodiments, the substrate is a flexible printed circuit board (PCB) and, in some embodiments, the substrate is a rigid-flex printed circuit board (PCB). For example, according to an aspect of the application, an axial magnetic flux sensor device comprising: a rigid substrate; a first plurality of partial loop conductive traces on the rigid substrate; a flex ribbon of conductive traces coupled to the rigid substrate at one end and couplable to the first substrate at a second end of the flex ribbon; a first pin and socket connector configured to couple the second end of the flex ribbon to the rigid substrate to form a single, continuous, substantially planar multi-loop coil. FIGS. 9A and 9B illustrate an example.

FIG. 9A illustrates an axial magnetic flux sensor on a rigid-flex printed circuit board (PCB), according to a non-limiting embodiment of the present application. The axial magnetic flux sensor 900 comprises a rigid-flex substrate, with a flexible portion 902a and rigid portion 902b. The axial magnetic flux sensor includes conductive traces 904. According to some examples, the conductive traces 904 may make up or be on the flexible portion of the rigid-flex PCB. According to some examples, the conductive traces 904 may be located partially on a flexible portion and partially on a rigid portion of the rigid-flex PCB.

The axial magnetic flux sensor 900 further comprises a trace connector 908a. The trace connector 908a comprises a first portion 910a that is not on the rigid portion 902b but that is connected to the flexible portion 902a, and a second portion 910b on the rigid portion 902b of the substrate. The flexible portion 902a of the rigid-flex substrate may flex and/or bend to connect and disconnect the trace connector 908a.

In the non-limiting example of FIGS. 9A and 9B, the substrate is shaped so that when the flexible portion 902a wraps around a piece of machinery and couples to the rigid portion 902b, as shown in FIG. 9A, an opening 916 exists, which can accommodate a motor shaft or other piece of machinery as shown in FIG. 9B. As described herein, the substrate is shaped so that it can support circuitry 914. For instance, the rigid portion 902b has sufficient space to the side of the conductive traces that circuitry can be placed there.

As described herein, while the axial magnetic flux sensor 900 includes a single substrate comprising a rigid and flexible portion, any other number and combination of substrate types may be used. For example, three substrates (e.g., sized to individually represent approximately one-third of a circle), four substrates (e.g., sized to individually represent approximately one-quarter of a circle), or other suitable numbers may be used having one or more rigid and/or flexible substrates.

As shown in FIG. 9B, the substrate of axial magnetic flux sensor 900 can be connected in a manner that forms a closed loop with the opening 916. The conductive traces 904 may couple to itself at connector 908a to form a single, continuous, multi-loop coil. The coil is substantially planar in some embodiments. The connector 908a allows for forming the rigid-flex PCB around the shaft of the motor 502 (which is shown in simplified form). The flexible portion of the substrate may be fixed in place in any suitable manner so as not to contact the shaft 504. For example, the flexible portion may be mounted to a substrate, tube, or other structure to ensure it maintains a loop shape without contacting the shaft 504.

Axial magnetic flux sensors as described herein may be used for condition-based monitoring of machines. The information detected from the axial magnetic flux sensors may be used on its own or in combination with data from other sensors to monitor the operating condition of the machine. As a result of the monitored condition, maintenance, repair, or replacement of machinery may be scheduled prior to the occurrence of significant and costly problems with the machine. In some embodiments, the occurrence of a machine failure may be predicted based on monitored condition data, which may allow for appropriate corrective action to be taken in advance of any such failure. Machine downtime and cost may be saved as a result.

What is claimed is:

1. An axial magnetic flux sensor device comprising:
   a first substrate;
   a second substrate couplable with the first substrate to form a substantially planar closed loop;
   a first plurality of partial loop conductive traces on the first substrate;
   a second plurality of partial loop conductive traces on the second substrate; and
   a first pin and socket connector and a second pin and socket connector configured to couple the first and second pluralities of partial loop conductive traces in a single, continuous, substantially planar multi-loop coil.

2. The axial magnetic flux sensor device of claim 1, wherein the first substrate and second substrate are printed circuit board (pcb) substrates.

3. The axial magnetic flux sensor device of claim 1, further comprising an amplifier coupled to one end of the single, continuous, substantially planar multi-loop coil.

4. The axial magnetic flux sensor device of claim 1, wherein the second pin and socket connector comprises a pin coupled to a trace which crosses over the second plurality of partial loop conductive traces.

5. The axial magnetic flux sensor device of claim 1, wherein a plug portion of the second pin and socket connector is disposed on the second substrate and is coupled to fewer than all of the second plurality of partial loop conductive traces on the second substrate.

6. The axial magnetic flux sensor of claim 5, wherein the first pin and socket connector is configured to couple the first and second pluralities of partial loop conductive traces in a one-to-one relationship.

7. The axial magnetic flux sensor of claim 5, wherein a first partial loop conductive trace of the second plurality of partial loop conductive traces is coupled to the first pin and socket connector and not the second pin and socket connector.

8. A flux detection system, comprising:
   a motor comprising a casing and a shaft extending out of the casing;
   an axial flux sensor positioned around the shaft outside the casing, and comprising:
      first and second coupled supports forming an opening through which the shaft passes;
      a first plurality of partial loop conductive traces on the first support;
      a second plurality of partial loop conductive traces on the second support;
      a first trace connector coupling the first plurality of partial loop conductive traces with the second plurality of partial loop conductive traces;
      a second trace connector coupling the first plurality of partial loop conductive traces with the second plurality of partial loop conductive traces; and
      readout circuitry coupled to at least one trace of the first plurality of partial loop conductive traces and configured to amplify a signal from the at least one trace.

9. The flux detection system of claim 8, wherein the first trace connector and second trace connector are configured to couple the first plurality of partial loop conductive traces with the second plurality of partial loop conductive traces in a single, continuous, multi-loop coil.

10. The flux detection system of claim 9, wherein the single, continuous, multi-loop coil is positioned substantially perpendicularly with respect to a length of the shaft.

11. The flux detection system of claim 8, wherein the first trace connector is a pin and socket connector.

12. The flux detection system of claim 8, further comprising a clamp coupling the first and second supports together.

13. The flux detection system of claim 8, wherein the first support is a printed circuit board (pcb), and wherein the readout circuitry is mounted on the pcb.

14. The flux detection system of claim 8, wherein the first plurality of partial loop conductive traces is on a first side of the first support, and wherein the flux detection system further comprises a third plurality of partial loop conductive traces disposed on a second side of the first support.

15. The flux detection system of claim 14, further comprising a fourth plurality of partial loop conductive traces coupled with the third plurality of partial loop conductive traces in a single, continuous, multi-loop coil.

16. A sensor for sensing axial magnetic flux, the sensor comprising:
   two couplable substrates, couplable to form a substantially planar closed loop;
   partial loop conductive traces on one substrate of the two substrates;
   partial loop conductive traces on another substrate of the two substrates; and
   two trace connectors configured to couple the partial loop conductive traces on the two substrates in a single, continuous, substantially planar multi-loop coil.

17. The sensor of claim 16, wherein the two substrates are printed circuit boards (pcbs).

18. The sensor of claim 16, wherein a first trace connector of the two trace connectors is a pin and socket connector.

19. The sensor of claim 16, wherein a first conductive trace of the partial loop conductive traces on the one substrate is coupled to a first trace connector but not a second trace connector of the two trace connectors.

20. The sensor of claim 16, wherein the substantially planar multi-loop coil defines an opening configured to receive a motor shaft.

21. An axial magnetic flux sensor device comprising:
   a rigid substrate;
   a first plurality of partial loop conductive traces on the rigid substrate;
   a flex ribbon of conductive traces coupled to the rigid substrate at one end and couplable to the rigid substrate at a second end of the flex ribbon; and
   a first pin and socket connector configured to couple the second end of the flex ribbon to the rigid substrate to form a single, continuous, substantially planar multi-loop coil.

* * * * *